United States Patent [19]

Thomson et al.

[11] Patent Number: 4,499,435
[45] Date of Patent: Feb. 12, 1985

[54] SYSTEM FOR LINEARIZING SWEEP OF VOLTAGE CONTROLLED OSCILLATOR

[75] Inventors: David W. Thomson, Palm Bay; Donald E. Trimble, Melbourne, both of Fla.

[73] Assignee: Harris Corporation, Melbourne, Fla.

[21] Appl. No.: 428,980

[22] Filed: Sep. 30, 1982

[51] Int. Cl.$^3$ .............................................. H03L 1/00
[52] U.S. Cl. ........................................ 331/44; 331/4; 331/178
[58] Field of Search ............................. 331/4, 44, 178

[56] References Cited

U.S. PATENT DOCUMENTS 3,764,933 10/1973 Fletcher et al. ................. 331/178 X
4,129,832 12/1978 Neal et al. ............................ 331/44
4,349,789 9/1982 Kurihara .................................. 331/4

Primary Examiner—Eugene R. LaRoche
Assistant Examiner—Robert J. Pascal
Attorney, Agent, or Firm—Antonelli, Terry & Wands

[57] ABSTRACT

Non-linearities in the sweep output of a voltage controlled oscillator are automatically linearized by a scheme that compensates for changes in slope of the variation in frequency with time during a high accuracy calibration mode, prior to placing the VCO into real time operation. During the calibration mode the sweep rate of the VCO is slowed down as the operational frequency range of interest is divided into a prescribed number of subfrequency segments or windows. During each window, an input control code, obtained from a random access memory (RAM) and representative of the intended slope of the VCO frequency sweep (for that window of interest), is applied to a digital-to-analog converter (DAC) whose output is integrated and applied to the voltage control input of the VCO. Since the output of the DAC is integrated, the frequency variation control signal to be applied to the VCO is a slope change control signal, which is incrementally adjusted, as required, during successive sweeps of the VCO, so as to produce a precompensated control voltage that will cause the rate of change of the VCO frequency output to track an intended ramp (linear with time) or other chosen frequency variation output.

31 Claims, 6 Drawing Figures

SYSTEM FOR LINEARIZING SWEEP OF VOLTAGE CONTROLLED OSCILLATOR

FIELD OF THE INVENTION

The present invention is directed to frequency sweep systems and particularly to a scheme for linearizing the sweep of a voltage controlled oscillator over a prescribed frequency range.

BACKGROUND OF THE INVENTION

In present day signal generation and processing systems, it is often necessary to produce a signal whose frequency can be varied or swept over a prescribed range. Usually, this involves the need for accurate tracking of signal frequency to a prescribed sweep control input. In many signalling applications, such as radar, spectrum analyzers, etc. the requisite sweep must be linear with time, i.e. a linear frequency ramp, to cover the frequency range of interest. Typically, a voltage controlled oscillator (VCO) is the elementary circuit component that has been used for accomplishing this task since, ideally, it produces an output frequency that is directly related to an input control voltage.

Unfortunately, even though it is possible to generate an input voltage the magnitude of which can be varied with precision, the components of which a voltage controlled oscillator is comprised are subject to environmental conditions, aging and drift, so that, in fact, there may be some degree of offset from the intended output frequency for a specified control voltage. To compensate for this deviation in intended output frequency, there have been proposed a variety of schemes for linearizing such controlled oscillators, both in real time and by way of preestablished compensation control signals. For example, the proposals described in Fletcher U.S. Pat. No. 3,764,933 and Carpenter U.S. Pat. No. 3,931,586 are real time systems that measure the deviation in the output frequency from an intended level, and inject a correction voltage into the principal control voltage during the oscillator sweep. Disadvantageously, real time control techniques suffer from a lack of speed, i.e. they limit the sweep speed of the VCO, thereby restricting their application and making them unattractive for optical signalling applications (not enough resolution can be obtained if the VCO is swept too fast).

Another linearizing proposal, as described in Neal et al U.S. Pat. No. 4,129,832, involves an operator-controlled calibration technique in which stepwise compensation or correction of the VCO is carried out during a test sweep mode by observing the degree of offset of the VCO output from an intended frequency characteristic, and storing respective correction signals to be used for reestablishing the output of the VCO at the proper frequency. The drawback to this approach is the "staircase" linearization employed, which leads to unacceptable variations in sweep output, so that conventional smoothing techniques for achieving the required output accuracy would result in a slow VCO sweep response; also, operator judgement during correction measurements leads to an additional unforseeable error.

For further illustrations of techniques for VCO linearization that embody conventional operational principles such as employed in the above-referenced systems, attention may be directed to Jackson U.S. Pat. No. 4,103,250; Borofka et al U.S. Pat. No. 4,038,612; Martin U.S. Pat. No. 3,504,294; and Weber U.S. Pat. No. 4,109,807.

SUMMARY OF THE INVENTION

In accordance with the present invention differential non-linearities in the sweep output of a voltage controlled oscillator are automatically linearized by a scheme that compensates for changes in slope of the variation in frequency with time during a high accuracy calibration mode, prior to placing the VCO into real time operation. During the calibration mode the sweep rate of the VCO is slowed down, as the operational frequency range of interest is divided into a prescribed number of subfrequency segments or windows. During each window, an input control code, obtained from a random access memory (RAM) and representative of the intended slope of the VCO frequency sweep (for that window of interest), is applied to a digital-to-analog converter (DAC) whose output is integrated and applied to the voltage control input of the VCO. Since the output of the DAC is integrated, the frequency variation control signal to be applied to the VCO is a slope change control signal, which is incrementally adjusted, as required, during successive sweeps of the VCO, so as to produce a precompensated control voltage that will cause the rate of change of the VCO frequency output to track an intended ramp (linear with time) or other chosen frequency variation output.

Pursuant to a first embodiment of the invention, the zero-crossings of the output of the varying frequency VCO are counted during each successive frequency window of interest. The total count number accumulated over a respective window is compared with a reference value that is associated with that particular window, and the reference code originally stored in RAM, from which the integration control signal for the DAC for that window is derived, is adjusted, if necessary, so as to reduce the difference between the count value and the reference value. When these two values effectively match each other, the adjusted code is written into the address in RAM from which the VCO slope-defining code for the window was derived. This process is repeated for each of the successive frequency windows into which the sweep range of the VCO has been subdivided so that, at the end of the calibration mode, the RAM contains DAC control codes which, when integrated, will cause the slope of the VCO to track an intended sweep profile.

In a second embodiment of the invention, a calibration process similar to the first embodiment is carried out, except that the reference code that is adjusted corresponds to the code for a window other than the window during which the differential measurement is being conducted. By successively adjusting the reference codes for each of the windows of the frequency range of the VCO over successive calibration cycles, the sweep output of the VCO is caused to incrementally converge about its intended profile.

Subsequent to the calibration of the reference codes in RAM, in accordance with either of the above-referenced embodiments, the sweep speed of the VCO is increased to the desired scanning rate and the adjusted reference codes are rapidly and sequentially readout of memory as the VCO is controlled thereby. Since, according to the present invention, VCO linearization is conducted prior to real time scanning, and at a slower rate, VCO tracking resolution accuracy can be significantly enhanced, and real time signal processing need not suffer from correction slowdown that occurs in prior art compensation schemes of the type mentioned above. This makes the present invention especially useful in optical signal processing environments, such as those employing RF chirp driven acousto-optic beam deflectors.

DETAILED DESCRIPTION

Figure 1:
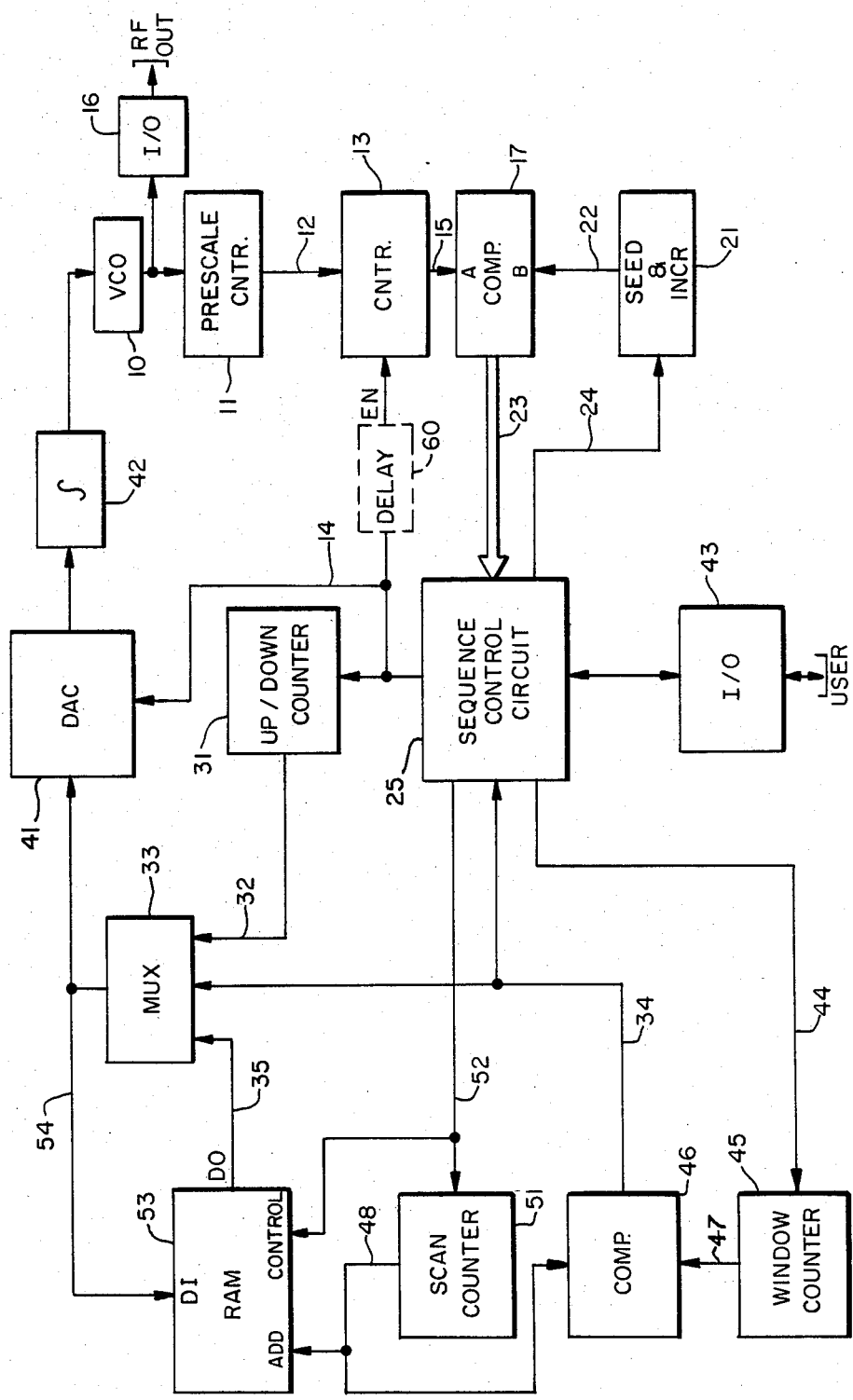
FIG. 1 is a schematic block diagram of a system for linearizing the sweep of a voltage controlled oscillator in accordance with the present invention.

Before describing, in detail, the particular improved VCO linearization scheme in accordance with the present invention, it should be observed that the present invention resides primarily in a novel structural combination of conventional digital and analog components and interface circuits, and not in the particular detailed configurations thereof. Accordingly, the structure, control, and arrangement of these conventional components and circuits have, for the most part, been illustrated in the drawings by readily understandable block representations and a schematic diagram, which show only those specific details that are pertinent to the present invention, in order not to obscure the disclosure with structural details which will be readily apparent to those skilled in the art having the benefit of the description herein. Thus, the block diagram illustration of the FIG. 1 does not necessarily represent the mechanical structural arrangement of the exemplary system, but is primarily intended to illustrate the major structural components of the system in a convenient functional grouping, whereby the present invention can be more readily understood.

Referring now to FIG. 1, wherein a schematic block diagram of the present invention is shown, a voltage control oscillator (VCO) 10, the output of which is to be controlled in accordance with a prescribed input control voltage which varies with time, as derived from an integrator 42, couples its frequency output through an interface unit 16 to an output port. VCO output port 16 may be employed for supplying a scan driving voltage for an acousto-optic beam deflector over a range of frequencies suitable for RF applications in optical signal processing. For purposes of an illustrative embodiment, this range may be considered to be on the order of 74–126 MHz, centered at 100 MHz, to be swept over a 130 microsecond nominal sweep time. Also, for purposes of the present description, it will be assumed that the sweep of the VCO is a ramp, namely, one that is linear with time. However, as mentioned previously, it is to be observed that the invention is not limited to a ramp sweep but is effectively applicable to any desired sweep profile. A ramp sweep profile has been chosen in the present description simply for purposes of ease of illustration.

Because of characteristics of the circuit components of the VCO 10, the output of the VCO may not precisely follow the input control voltage from integrator 42 which integrates an input control current level generated by a digital-to-analog converter (DAC) 41. These characteristics may include temperature, aging and drift, so that for any particular input control voltage which is used to define a corresponding output frequency from the VCO, there may be some deviation from the frequency intended. The system shown in FIG. 1 which is coupled with the input and output of VCO 10, operates to linearize the sweep output of the VCO, namely it compensates for non-linearities in the operation of the controlled oscillator so as to accurately track an intended frequency sweep profile as defined by an input control voltage.

For this purpose, the output of the VCO 10 is coupled through a prescale circuit 11 over line 12 to a zero-crossing counter 13. Zero-crossing counter 13, when enabled by a signal on control link 14 from a sequence control circuit 25, counts the number of pulses produced by prescale circuit 11 representative of the zero-crossings in the oscillation output signal generated by VCO 10 and stores this count until reset. As will be explained below, counter 13 is controllably enabled during selected frequency subintervals (or windows) during which linearization of the operation of the VCO is conducted.

Counter 13 supplies a digital code representative, within a prescribed tolerance or prescale adjustment, of the total number of zero-crossings accumulated during a respective frequency window over link 15 to an input port A of a digital comparator 17. A second input port B of comparator 17 is coupled over link 22 to the output of a seed word and increment circuit 21. Circuit 21 may be comprised of a storage register, the initial contents of which are preestablished by way of a set of external thumbwheel switches (not shown) that are used to define a reference count, indicative of the number of zero-crossings associated with the frequency output of voltage controlled oscillator 10 for a frequency window at the beginning of the sweep at one end of the frequency range. In the example chosen, this count may be representative of the number of zero-crossings which occur during the initial or zero window in which VCO 10 produces an output frequency that starts at a lower end reference (74 MHz) and increases to a frequency within the exemplary range of 74–126 MHz. A control line 24 from sequence control circuit 25 is employed to increment (or decrement, depending upon whether the sweep is an increasing or a decreasing sweep) the contents of register 21.

Digital comparator 17, which compares the contents of counter 13 and the contents of register 21, has a set of output lines 23 that are coupled to sequence control circuit 25. These lines produce respective control codes indicative as to whether the count on link 15 applied at port A is greater than the value applied over link 22 to port B, whether the values are equal to one another, within a prescribed tolerance, or whether the count value on link 15 applied at port A is less than the reference value applied over link 22 at port B (again beyond a prescribed tolerance). Sequence control circuit 25 itself is essentially a timing sequence circuit (or state machine) comprised of combinational logic that causes the components illustrated in FIG. 1 to carry out a succession of operations to be described more fully below. Sequence control circuit 25 could also be comprised of a suitable micro-processor which is software-controlled pursuant to the principles embodied herein. As the details of the contents of such a sequence control circuit are not necessary for an understanding of the present invention, they will not be described here. Instead, the scenario of operations to be conducted and the manner in which sequence control circuit responds to various signal inputs and delivers output control signals to the components of FIG. 1 in accordance therewith will be set forth in detail, so as to facilitate a complete appreciation of the interrelationship of the components and operation among the components shown in FIG. 1.

Control of the cyclic sweep of the voltage controlled oscillator 10 and the rate of change in its sweep is carried out by a set of counters, including a scan counter 51, a window counter 45 and an up/down counter 31, each of which is controlled by sequence control signals from the sequence control circuit 25, as will be explained in more detail below. The operation of the voltage controlled oscillator 10 is controlled by a set of digital codes stored in a respective set of addresses in a random access memory (RAM) 53 that are accessed in sequence by a scan counter 51 and applied to DAC 41. Each control code that is readout of RAM 53 is coupled over link 35 through a multiplexer 33 to the digital input of DAC 41. Line 54 is also coupled to the write input of RAM 53 and operates to update the contents of RAM 53 during the calibrate mode of the system, as will be explained in more detail below. Suffice it to say, for purposes of the present description of the components of the circuitry shown in FIG. 1, that DAC 41 responds to a digital code on line 54 from multiplexer 33 and produces an output current corresponding to the digital code supplied thereto. This analog current is integrated by integrator 42 and supplied as a control voltage to voltage controlled oscillator 10. For purposes of a linear sweep, in an ideal situation with no variation in the intended ramp output of voltage controlled oscillator 10 for a linear sweep voltage input, a nominal control digital code would be supplied to DAC 41 and a corresponding constant current output thereof would be integrated by integrator 42 to supply a linearly changing voltage ramp to voltage control oscillator 10, as represented by ramp 80 shown in FIG. 3, which illustrates the output of the voltage controlled oscillator 10 for a prescribed portion of a frequency ramp during successive windows, to be described in more detail below.

DAC 41 is enabled by a signal on line 14 from the sequence control circuit 25, so as to produce an output current corresponding to the value of the digital codes read out from RAM 53 for successive frequency windows, as will be described below. Line 14 is also coupled to increment or decrement the contents of up-/down counter 31 in accordance with a decision carried out by the combinational logic within sequence control circuit 25, based upon the control signals coupled over link 23 from digital comparator 17. Up/down counter 31, when reset, contains a nominal code value corresponding to a code that will cause DAC 41 to produce a constant current output which, when integrated, produces a voltage ramp for controlling VCO 10 in order to produce an intended frequency ramp at the output thereof. The digital code that is stored in up/down counter 31 is coupled over line 32 to multiplexer 33. Multiplexer 33 will couple the contents of RAM 53 as supplied over signal link 35, or the contents of up/down counter 31 as supplied over link 32, depending upon the state of a control signal applied over line 34 from a digital comparator 46. Control line 34 is also coupled as an input to which sequence control circuit 25 responds in controlling the operation of up/down counter 31 and DAC 41, as will be described below.

A digital comparator 46 has a pair of input links 47 and 48 respectively coupled to receive the contents of counters 45 and 51, respectively. Counter 45, identified as a window counter, is employed to identify successive windows within a frequency range of interest during which the calibration of a prescribed portion of the output of VCO 10 is to be conducted. In the exemplary embodiment described herein, for a 130 microsecond sweep of VCO 10 during its normal operation, window counter 45 may be coupled to count up to a value representative of 130 windows each having a duration covering a prescribed time interval. During the calibrate mode, the system is operated at a speed much slower than that during its run mode so that each window is not equal to the one microsecond interval that would otherwise occur during the run mode, but it may be equal to a much larger value, for example on the order of 200 microseconds each. Line 44 is employed by sequence control circuit 25 to increment window counter 45 as the calibration process steps through the individual windows of the sweep of control oscillator 10, as will be described in more detail below with reference to FIGS. 2-6.

The other link 48, which is coupled to comparator 46, is derived from a scan counter 51 which generates successive addresses on link 48 to cause RAM 53 to produce successive control codes that are selectively coupled through multiplexer 33 to DAC 41, whereby integrator 42 may integrate the contents of DAC 41 and cause VCO 10 to sweep through a frequency characteristic (such as a ramp) of interest. Scan counter 51 may comprise an up/down counter that is incremented (or decremented, depending upon the direction of sweep) by a control signal on line 52 from sequence control circuit 25. Signal line 52 is also coupled to the control input of RAM 53 to control the coupling of the contents of link 54 into an address as defined by link 48 from counter 51.

For purposes of external access, initialization and run control, an input/output coupling circuit 43 is coupled between supervisory control circuitry (not shown) and sequence control 25 in a manner well known in the art.

An additional circuit component, shown in broken line form in FIG. 1, comprises a delay circuit 60 that is coupled in signal line 14 between the output of sequence control circuit 25 and the input of counter 13, as shown, for an embodiment of the invention which operates in a manner different from that in which the delay circuit is removed, as will be described in detail below in conjunction with the timing diagrams of FIGS. 4-6. This delay circuit introduces a delay of one window time for the enabling signal from sequence control circuit 25 to counter 13, which causes counter 13 to count zero-crossings for a window subsequent to the window in which a correction will be carried out. As mentioned previously, this frequency window offset control procedure adjusts the slope of VCO 10 for a particular window based upon the frequency output of VCO 10 for a different time period than the one being corrected. This has the effect, for successive calibration cycles, of causing a convergence of the modified, calibrated slope control inputs for VCO 10 about the intended ramp function, as will be explained in more detail to follow, in conjunction with the description of FIGS. 4–6.

For purposes of describing the present invention, an initial embodiment will be considered in which the delay circuit 60 is not included within signal line 14, so that the operation of the system for a particular window of interest is based upon the output of the VCO for that window of interest.

Figures 2, 3:
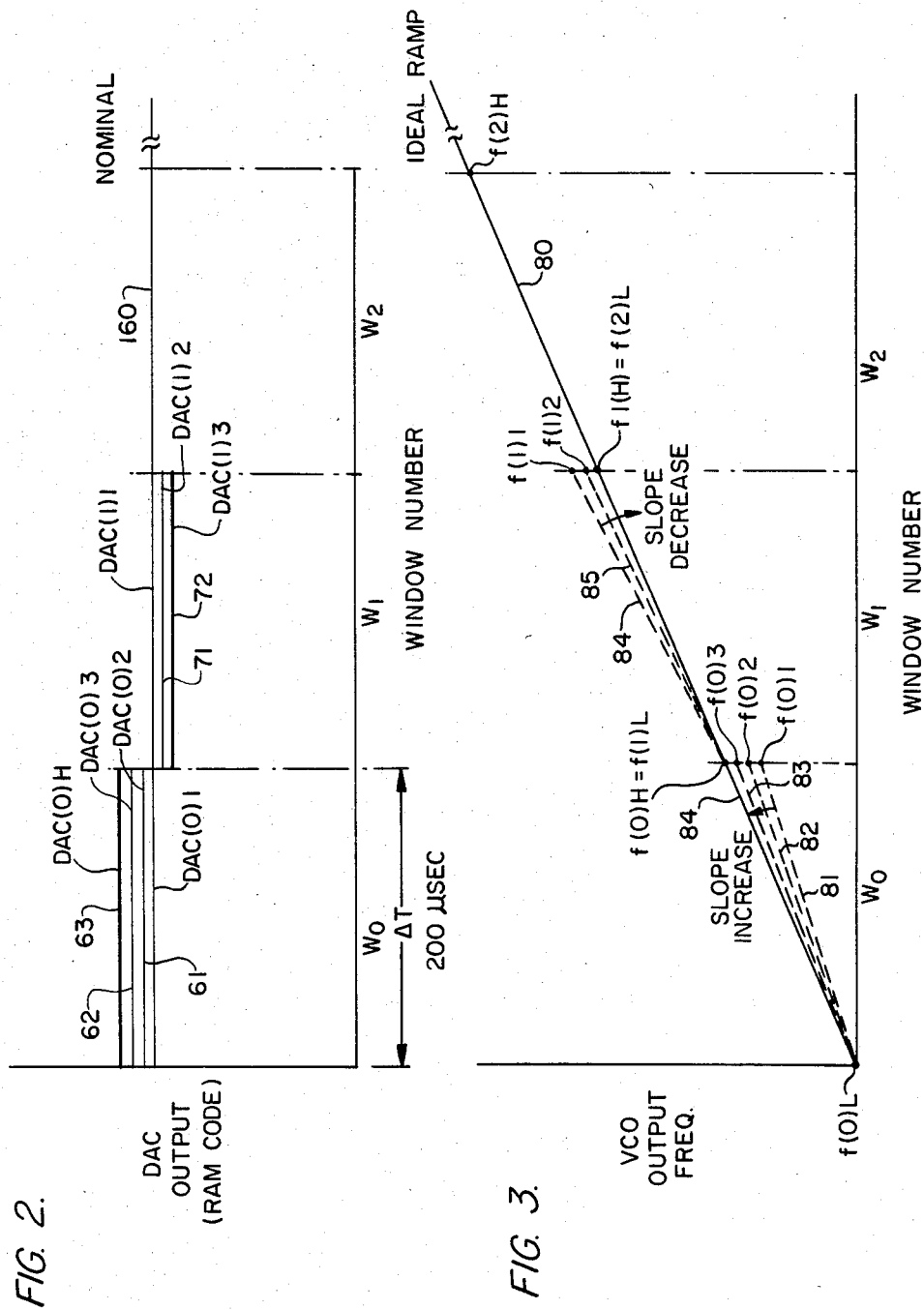
FIG. 2 is a timing diagram showing an example of the relationship between the VCO sweep control code level and scan subdivision windows for a first embodiment of the invention.
FIG. 3 is a timing diagram storing an example of the relationship between VCO output frequency and scan subdivision windows for the VCO sweep control code levels of FIG. 1.

Referring now to FIGS. 2 and 3 the operation of a first embodiment of the linearizing system shown in FIG. 1 will be explained. Initially, each of scan counter 51, window counter 45, up/down counter 31 and counter 13 is cleared and counter 13 is disabled from counting until it receives an enable signal on line 14 from sequence control circuit 25. For purposes of the present description, it will be assumed that the variation in the output of the voltage controlled oscillator 10 is to follow a linear ramp from a prescribed lower frequency (e.g. 74 MHz) to a prescribed upper frequency (e.g. 126 MHz). During actual operation of the system, this ramp, which may be used for driving an acousto-optic beam deflector, as mentioned previously, is repeated over successive 130 microsecond intervals. During the calibration of the system in accordance with the present invention, the ramp sweep time is lengthened considerably to 130, 200 microsecond, intervals covering the entire sweep range of the VCO 10. The sweep begins at 74 MHz at the lower end of the range and proceeds linearly to 126 MHz at the upper end of the range. Pursuant to the calibration scheme according to the present invention, this idealized ramp is compared with what is actually produced by the VCO 10 and differences therebetween are compensated by adjusting, incrementally, the slope of the input control signal for the voltage control oscillator 10, to bring the actually produced frequency ramp output thereof into effective alignment with the idealized ramp profile intended.

FIGS. 2 and 3 respectively show the output of the DAC 41 and the VCO 10 for successive windows $w_0$–$w_3$ within the 130 window-containing sweep range of the system.

At the beginning of the calibration process, a seed word, corresponding to a code which represents the number of zero-crossings expected to be encountered by VCO 10 as it is swept or increased from an initial starting point frequency of 74 MHz to a prescribed upper frequency limit for that particular window, is stored in register 21 from an external input source, such as a set of thumbwheel switches, noted previously. Each of scan counters 51 and 45, as well as counter 13, is cleared while the contents of up/down counter 31 are reset to a nominal value, such as half scale, as noted above. As the calibration scheme begins at the initial window $w_0$ within the scan, the contents of scan counter 51 and window counter 45 are the same, so that comparator 46 produces an output on line 34 which is coupled to sequence control circuit 25 and multiplexer 33. Multiplexer 33 operates to couple output signal line 35 from the readout line of RAM 53 to line 54 during all times except when it receives a signal on line 34 from comparator 46 indicating that the contents of scan counter 51 match those of window counter 45. In this circumstance, multiplexer 33 switches output line 54 to input line 32 from up/down counter 31. For the window $w_0$ of interest, therefore, multiplexer 33 switches the half scale code provided by up/down counter 31 on line 32 to output line 54, and this code is supplied to DAC 41.

Sequence control circuit 25 responds to the signal on line 34 and enables counter 13 for the duration of the window of interest, namely for the 200 microsecond duration of window $w_0$, while it enables DAC 41 to produce a constant current output representative of the half scale code applied by up/down counter 31. This half scale or nominal constant current value supplied by DAC 41 is shown as line 160 in FIG. 2 for the successive windows 0, 1, 2, etc. This level is identified as level DAC (0)1 for the first pass or sweep within the calibration cycle for window $w_0$. Integrator 42 integrates this constant current input during the window $w_0$ and supplies a ramp voltage to VCO 10 during this time frame. VCO 10, in turn, produces a frequency sweep beginning with 74 MHz to a frequency value increased along a produced ramp. At the end of the interval $w_0$, this frequency, if ideal, should reach 74.4 MHz. The number of zero-crossings for that frequency sweep (i.e. 74–74.4 MHz) during window $w_0$ is produced into pulses by prescale counter 11 and these clock pulses are counted by counter 13. Prescale counter 11 truncates a prescribed small number of the least significant bits from the number of clock pulses produced over link 12 in order to provide a code within the tolerance capability of register 21.

As shown in FIG. 3, for purposes of illustrating the corrective linearizing action of the present invention, it has been assumed that VCO 10 operates so as to provide a frequency ramp output that is less than the intended or ideal ramp 80 for window $w_0$. This is identified by frequency ramp 81 beginning at the 74 MHz starting point at the lower end of the ramp for window $w_0$ and ending at some greater frequency which is less than the 74.4 MHz lying on the ideal ramp function 80. This non-intended frequency that has been produced is identified as frequency f(0)1. Since the slope of the sweep of VCO 10 during window $w_0$ is less than the slope of the intended ramp, the number of zero-crossings counted by counter 13 will be less than the value set in register 21. Comparator 17 will therefore deliver, over link 23, a signal indicating that the count from register 21 on link 22 exceeds the count on link 15 from counter 13. This signal is read by sequence control circuit 25 at the end of the 130, 200 microsecond, sweeps for all 130 windows. As a result, at the end of window $w_0$, sequence control circuit 25 delivers a signal over line 52 incrementing scan counter 51 and supplying a read-enable control signal on line 52 to RAM 53.

With scan counter 51 having been incremented, its value now differs from that of window counter 45, which is not changed until window $w_0$ has been calibrated. At present, it has been determined that the nominal current level represented by the contents of up/down counter 31 is insufficient to cause VCO 10 to track the ramp 80 within window $w_0$, so that the code needs to be incremented to increase the current supplied to integrator 42. This operation takes place during succeeding intervals as will be explained in more detail below. At present, since the contents of counters 51 and 45 do not match, line 34 at the output of comparator 46 changes state, so that multiplexer 33 switches output line 54 to input line 35 and the contents of RAM 53, as addressed by the contents of scan counter 51, are read out and supplied to DAC 41. Since line 34 has changed state, sequence control circuit 25 does not supply an enable signal over line 14, so that the contents of up/down counter 31 are not modified and an enable signal is not supplied over line 14 to counter 13.

This process is sequentially repeated as scan counter 51 is incremented by successive clock signals produced by sequence control circuit 25 corresponding to the 130 successive, 200 microsecond, windows until completion of the 130th window interval. At the end of the 130th window interval, scan counter 51 is caused to roll over (corresponding to the flyback time of the VCO 10). At this time, sequence control circuit 25 looks at the contents of link 23 to determine the relationship between the count in counter 13 that was stored for the window specified by window counter 45 (here window $w_0$) and the seed word stored in register 21. As noted previously, the count on link 15 is less than the count on line 22, so that sequence control circuit 25 supplies an increment signal to up/down counter 31, to increment the code contained therein to a value above the nominal level initially stored.

As scan counter 51 rolls over to begin the scan at the initial address corresponding to window $w_0$, comparator 46 again detects a match between the contents of window counter 45, which have not yet been modified, and the address within RAM 53 corresponding to window $w_0$. This causes multiplexer 33 to couple the contents of up/down counter 31 to output line 54. Sequence control circuit 25 also responds to the signal on line 34 to supply an enabling signal to DAC 41 and counter 13, so that counter 13 again counts the zero-crossing pulses from counter 11 during the sweep or scan of VCO 10 during the new window $w_0$. Since up/down counter 31 has been incremented, the current level supplied by DAC 41 is increased by a prescribed amount identified as level DAC (0)2 or line 61 for window $w_0$ in FIG. 2. This new constant current level is integrated by integrator 42 to supply a new ramp voltage to VCO 10. The corresponding frequency output ramp is identified as line 82 for window $w_0$ in FIG. 3 beginning at the lower end frequency $f(0)L$ or 74 MHz in the example given, and terminates at an upper frequency $f(0)2$ at the end of window $w_0$. This increase in frequency results in the number of pulses counted by counter 13 to be greater than the number counted during the previous cycle. However, as can be seen from FIG. 3, the total count value is still assumed to correspond to a frequency ramp having a slope less than the slope of ideal ramp 80. This will result in comparator 17 producing an output indicating that the contents of register 21 again exceeds the count value on line 15 from counter 13. As a result, at the end of the current sweep of the 130 window interval, sequence control circuit 25 will read the signals on line 23 and be advised that up/down counter 31 needs to be further incremented.

The above process is repeated two more times as the contents of up/down counter 31 are successively incremented, to produce increased values of constant current levels produced by DAC 41 corresponding to current levels DAC (0)3 or line 62 and DAC (0)H or line 63 as shown in FIG. 2. During the fourth sweep or the third occurrence of incrementing the contents of up/down counter 31, the slope of frequency ramp produced by VCO 10 is determined to be sufficient to produce a number of zero-crossings which provide a scaled count that matches the value stored within register 21. This corresponds to the output of VCO 10 having produced a frequency ramp 84 which corresponds substantially to ramp 80 within window $w_0$. The upper frequency reached ($f_{(0)H}$) is determined to be within the tolerance limits of operating the VCO to follow ramp 80. The code that produces this ramp is currently stored in up/down counter 31. Since the contents of counter 13 and register 21 match one another, sequence control circuit 25 no longer increments the contents of up/down counter 31. As scan counter 51 rolls over to the initial address within RAM 53, in response to the signal on line 23, sequence control circuit 25 again responds to the signal on line 34 and the signal on line 23 causes the contents of up/down counter 31 to be written into memory 53 as multiplexer 33 switches output link 54 to input link 32 due to the window-scan address match comparison from comparator 45 on line 34.

At the end of the current window $w_0$, wherein VCO 10 now produces an output frequency profile having a slope that effectively tracks the slope of the intended ramp and, in response to the comparison signal on line 23, obtained at the end of the previous cycle, sequence control circuit 25 delivers an increment signal over line 44 so as to increment window counter 45. Window counter 45 now contains the identity of window number-1 ($w_1$), the next window interval of interest. As scan counter 51 is incremented to this window $w_1$, comparator 46 again detects a match between the contents of counter 51 and the contents of window counter 45.

As noted above, at the end of the calibration of the window $w_0$, the contents of up/down counter 31 were written into memory 53, so that during subsequent scans of window $w_0$ DAC 41 will deliver to integrator 42 an adjusted current level output (level 63 in FIG. 2) which, when integrated by integrator 42, causes VCO 10 to produce a frequency ramp $f(0)H$ along the intended profile 80. Now, the tendency of VCO 10 to depart from its intended profile 80 varies rather slowly, so that the behavior of the VCO can be expected to be somewhat the same over a number of successive windows. In the present example, it means that for at least several windows $w_1$, $w_2$, $w_3$, VCO 10 can be expected to behave as it did for window $w_0$ and produce an output having a slope less than that of intended profile 80. Accordingly, when the calibration process described above for window $w_0$ begins for window $w_1$, the current value of up/down counter 31 is coupled over line 32, through multiplexer 33, to DAC 41. As a result, at the start of the calibration procedure for window $w_1$, the output of DAC 41 is at the same level as line 63 for window $w_0$. Depending upon the resulting slope of the profile of the frequency ramp produced by VCO 10 for window $w_1$, the contents of up/down counter 31 are again incremented or decremented as necessary, until the ramp for window $w_1$, effectively follows the intended profile 80, at which time the scan advances to window $w_2$ and the process is again repeated, etc.

Now, rather than start the calibration of each window $w_i$, using the current contents of up/down counter 31 as maintained at the end of the calibration of window $w_{i-1}$, the contents of up/down counter 31 may be reset to the nominal value which causes DAC 41 to produce its nominal current output along line 160, as shown in FIG. 2, for each window. In this instance, as shown for window $w_1$ in FIGS. 2 and 3, it will be assumed that the nominal code (line 160) causes VCO 10 to produce a frequency sweep (beginning at the upper frequency reached at the end of window $w_0$ or the beginning frequency $f(1)L$) that increases to a value $f(1)1$ along line 84. This, in turn, causes counter 13 to detect a number of zero-crossings in excess of the intended value that would follow ramp 80 during window $w_1$. In response to the contents of counter 13 exceeding the incremented value of the contents of register 21, sequence control circuit 25 causes the contents of up/down counter 31 to be decremented from the code which produces a nominal constant current at level 160 (DAC (1)1) to a level 71 (DAC (1)2) as shown in FIG. 2. During the next sweep, this results in VCO 10 sweeping at a slower rate along slope line 85 to reach a new end value f(1)2 at the end of window $w_1$ as shown in FIG. 3. This process continues until, eventually, the decremented slope output of VCO 10 is effectively aligned with ramp 80, as determined by comparator 17. In response to a match between the contents of counter 13 and the incremented value in register 21 for window $w_1$, the decrement-modified contents of up/down counter 31 during the successive cycles of calibration for window $w_1$ are loaded into RAM 53 as identified by the contents of address counter 51, and window counter 45 is advanced to the next window $w_2$, as explained above in conjunction with the incrementing of the windows from $w_0$ to $w_1$. This process is repeated until all 130 windows have been calibrated.

At the end of the above-described calibration process, during which all 130 windows have been processed, namely once window counter 45 reaches full scale, calibration of the VCO 10 by sequential modification of the sweep control codes in RAM 53 has been completed. Of course, the process may be repeated, periodically, as required, to compensate for VCO drift over extended periods of operation. Of significance is the fact that at the end of the completion of calibration for each interval within the sweep range of interest, RAM 53 will contain a modified code, as determined by the finally established contents of up/down counter 31 for that particular window, which will cause VCO 10 to track the ramp as defined by the successively incremented contents of register 21.

It should be noted that the calibration process need not follow a ramp, but may be employed for any characteristic curve as controlled by sequence control circuit 25 as it modifies the contents of register 21; namely, the codes that are supplied over line 24 need not be of a constant value, but may be modified to produce a nonlinear ramp or whatever curve is of interest. It is this incremental subdivision of the overall frequency range into sequential slope segments that enables the invention to achieve the tracking capability described above.

At the end of the calibration cycle, through an external control signal supplied through interface circuit 43, the clock that is supplied from sequence control circuit 25 for sequentially incrementing scan counter 51 may be increased substantially, so that the scan counter steps through the contents of RAM 53 at a much more rapid rate, (e.g. at a rate such as the one microsecond intervals described above for an overall frequency sweep time of 130 microseconds for the 74–126 MHz range of interest). Of course, with an increase in scan rate, the time constant of integrator 41 is also changed to match the new sweep speed. This is preferably achieved by a suitable switchover circuit, not shown, which forms part of the integrator 42, and which responds to an external control signal for this purpose. Advantageously, since the previous calibration mode is carried out at a much slower rate, the desired frequency sweep range may be subdivided into segments or windows that provide the necessary resolution.

In accordance with the foregoing embodiment, the beginning of the calibration sweep always starts at the same lower frequency (e.g. 74 MHz) with precision. This may be accomplished by using a suitable frequency initialization control circuit, such as one including phase lock loop frequency-control circuitry. However, where the nominal starting frequency is subject to being offset beyond the intended tolerance of the ramp of interest, a modification of the embodiment described above in conjunction with FIGS. 2 and 3, and more clearly shown in detail in FIGS. 4–6 may be provided. In this instance, an additional component, specifically the delay circuit 60 referenced previously, is included within the system shown in FIG. 1, so as to delay the counting action of counter 13 an interval later than that identified by window counter 45, so that the frequency ramp window for a relatively later window subinterval is employed to control the ramp code to be used for a relatively earlier subinterval window.

More specifically, while the same operational scenario described above in conjunction with the first embodiment of the invention takes place, the insertion of a delay circuit 60 into the signal line 14 effectively delays the interval during which counter 13 counts zero-crossing pulses or, in other words, it causes the system of FIG. 1 to generate a frequency variation control code during an interval i based upon the operation of the voltage controlled oscillator during a subsequent interval (i+1) (e.g. window $w_{j+1}$).

Figure 4:
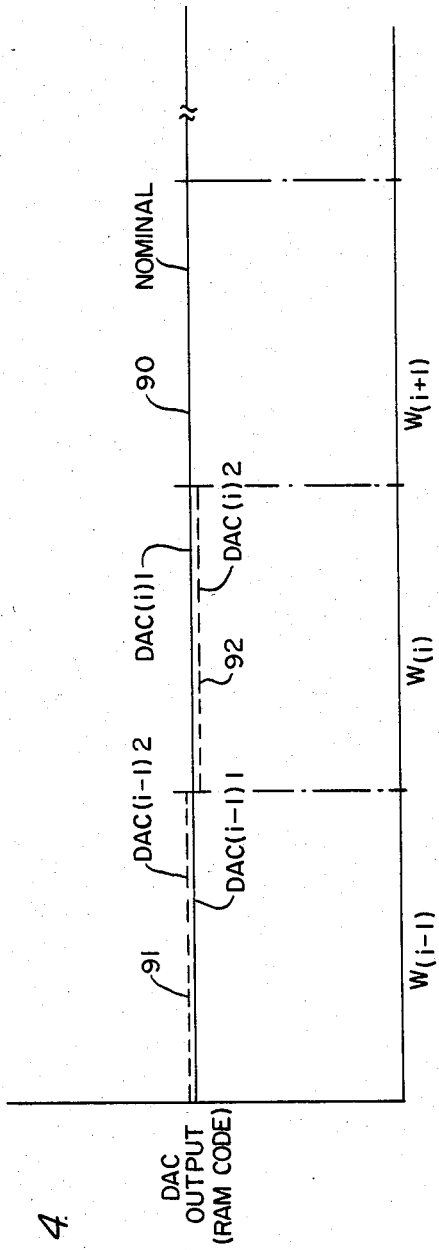
FIG. 4 is a timing diagram showing an example of the relationship between a VCO sweep control code level and scan subdivision windows for a second embodiment of the invention.
Figure 5:
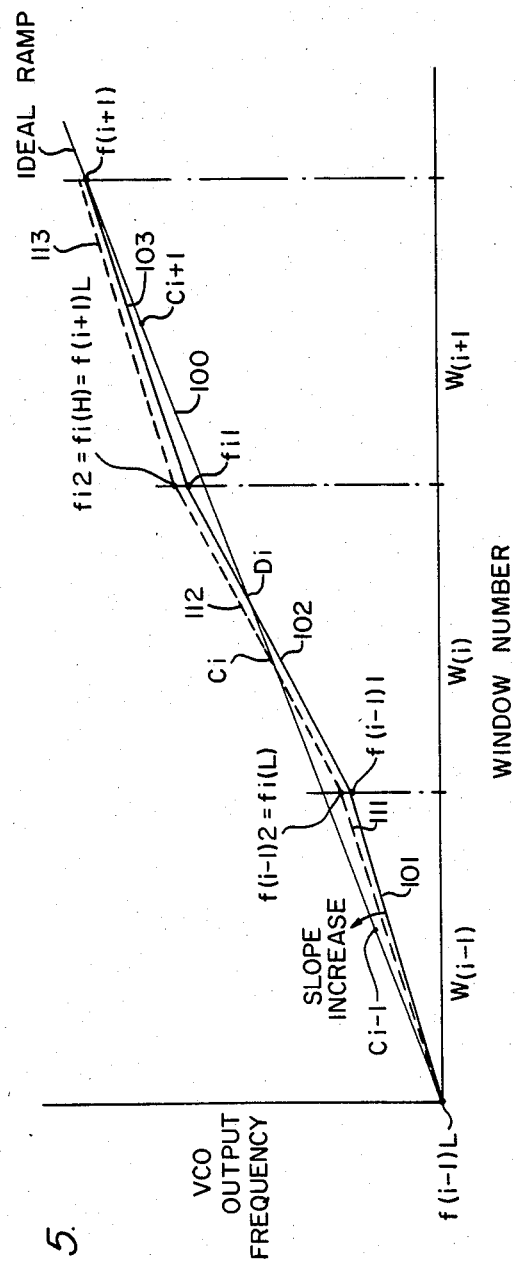
FIGS. 5 and 6 are timing diagrams showing an example of the relationship between VCO output frequency and scan subdivision windows for the VCO sweep control code levels of FIG. 4.
Figure 6:
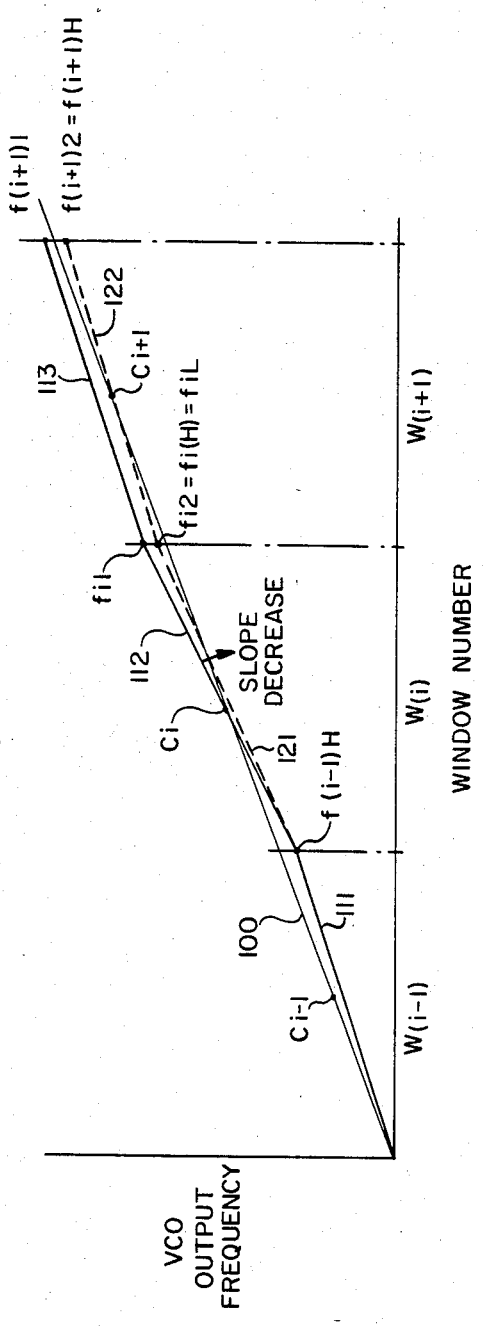

This may be more readily understood with attention directed to FIGS. 4–6 which show a window sequence similar to FIGS. 2–3, wherein up/down counter 31 is reset to a nominal code value causing DAC 41 to produce a nominal current level output 90 at the start of each window. It should again be noted, however, that due to the expected gradual variation in the frequency profile output of VCO 10, the contents of up/down counter 31 at the end of window i may be used as a starting point for window $W_{i+1}$, as explained above for the first embodiment. FIG. 4 is similar to FIG. 2 in that it shows the constant current level outputs with variations to levels 91, 92 of DAC 41 for successive window numbers, here window numbers $w_{i-1}$, $w_i$ and $w_{i+1}$. FIGS. 5 and 6 show variations in VCO output during these window intervals.

For purposes of the present description, it will be assumed that delay circuit 60 imparts a delay corresponding to a single window time interval or, in the exemplary embodiment chosen, 200 microseconds during the calibration cycle. Considering a window $w_i$, for example, multiplexer 33 will supply a code from RAM 53 to DAC 41 indicative of a prescribed current level to be integrated by integrator 42 and applied to the control input of VCO 10. For window $w_i$, this may correspond to a nominal current level 90 as noted above.

Referring to FIG. 5, the ideal frequency ramp is designated by line 100. Let it be assumed that the actual frequency variation produced by VCO 10 follows the sequence of lines 101-102-103. During window $w_{i-1}$, the frequency scan begins at a lower frequency $f_{(i-1)L}$ and ends at an upper frequency $f_{(i-1)1}$. Frequency $f_{(i-1)1}$ is the lower frequency for window $w_i$ which ends at a upper frequency $f_{i1}$. Since the ramp segment 101 within window $w_{i-1}$ has a slope less than the ideal ramp 100, the starting point of ramp segment 102 within window $w_i$ begins at a frequency lower than the initial frequency for the ideal ramp 100 within that window. On the other hand, the slope of ramp segment 102 that is actually produced by VCO 10 is greater than the slope of the ideal ramp, so that the upper frequency reached at the end of window $w_i$, namely frequency $f_{i1}$, exceeds that of the ideal ramp along trace 100. It is this frequency ramp along trace 102 that is integrated during window $w_i$ and used to modify the code for window $w_{i-1}$ because of the insertion of delay circuit 60 in signal line 14. The same operation described above in conjunction with the first embodiment of the invention takes place, except for the fact that counter 13 is enabled during a time interval later (e.g. one window interval later) than the window defined by the contents of window counter 45. This means, considering window counter 45 to contain a number corresponding to window $w_{i-1}$, that counter 13 will count clock pulses for window $w_i$. Thus counter 13 counts zero-crossing pulses corresponding to ramp 102 within window $w_i$, as shown in FIG. 5.

If the VCO is tracking correctly, then the slope of the ramp during window $w_i$ will cross or intersect the ideal ramp 100 at a centerpoint $C_i$ thereof. In the illustration shown in FIG. 5, however, ramp 102 crosses or intersects ramp 100 at a point $D_i$ which occurs later in time than the centerpoint $C_i$ of ramp 100. Therefore, the number of zero-crossing pulses counted by counter 13 during the interval $w_i$ will be less than the number that would be achieved for the frequency ramp 100 during window $w_i$, even though the slope of curve 102 is greater than the slope of the ideal ramp 100 during that time interval. As a result, up/down counter 31, for interval $w_{i-1}$, namely, the previous interval, will be incremented, to cause DAC 41 to produce an increased output current level 91, so that VCO 10 will produce a new slope along line 111, beginning at lower frequency $f_{(i-1)L}$ and terminating at new upper frequency $f_{(i-1)2}$. Then, during window $w_i$, a new ramp 112, having the same slope as ramp 102, will intersect ideal ramp 100 closer to the centerpoint $C_i$. For purposes of simplifying the present example, it will be assumed that this intersection point falls substantially at point $C_i$. As a result, comparator 17 detects a match (for window $w_i$ due to delay circuit 60), so that the code for window $w_{i-1}$ will no longer be incremented.

As window counter 45 is then incremented to the next window $w_i$, so that counter 13 observes the number of zero-cross impulses produced for window $w_{i+1}$, it is the slope within window $w_i$ that is modified. This is shown in FIG. 6, wherein, as a result of the offset of trace 113 from ramp 100, the contents of up/down counter 31 for window $w_i$ are decremented, causing DAC 41 to produce a decreased output current level 92 so that the slope of the ramp produced by VCO 10 during window $w_i$ decreases from its previous ramp 112 to a new ramp 121. This means that during window $w_i$, ramp 112 no longer intersects ramp 100 at substantially the centerpoint thereof, but is slightly offset therefrom. Still, the start frequency $f_{(i-1)H}=f_{(i)L}$ is fixed; only the slope changes. This decrease in slope during window $w_i$ causes a constant decrease in frequency, but no slope change from ramp segment 113 to ramp 122. As can be seen in FIG. 6, ramp 122 intersects ideal ramp 100 at centerpoint $C_{i+1}$, so that after a single decrement operation (for the example chosen) counter 17 produces a match-representative output on link 123, whereby the contents of up/down counter 31, which have been decremented by a single slope change for window $w_i$, will be stored in RAM 53 and used for the subsequent control VCO 10 during window $w_i$.

Through the above process, repeated for successive intervals, variations in the output of VCO 10 from the intended ideal ramp are caused to converge, incrementally (in terms of window width) about the true ramp intended. In the present embodiment, for successive repetitions of a complete calibration cycle for each of the 130 windows of interest, the slight undulations of the ramp output of VCO 10, as defined by the control codes in RAM 53, converge tightly about ramp 100, so that a substantial linearization of the VCO 10 is achieved.

As pointed out above, in accordance with the second embodiment of the invention, even if there is an offset in the starting frequency from a required absolute initialization frequency within the tolerance limits of the VCO, this offset can be corrected by incrementally adjusting the slopes of the window segments on the basis of incremental frequency ramp variations for the VCO at window intervals other than those in which the corrections are being made. In the first embodiment of the invention described above in conjunction with FIGS. 2 and 3, an a priori requirement is the starting frequency at the beginning of the sweep be within an acceptable tolerance of the ramp 80. While this can be achieved using precise frequency control components for driving the VCO, such as the above-mentioned phase lock loop control circuitry, the use of the second embodiment of the invention avoids the need for concern of the precision of the starting point of the frequency sweep.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. For use with a variable frequency generator which produces a variable output frequency the value of which depends upon an input control signal applied thereto, a system for correcting for deviations in the output frequency variation produced by said generator from an intended frequency variation as defined by a prescribed input control signal variation comprising:

first means for supplying to said variable frequency generator a plurality of input control signals the value of each of which changes with time so as to have a respective prescribed slope during a respective subinterval of time within a defined interval of time during which said variable frequency generator is to produce said intended frequency variation, said first means including memory means for storing a plurality of input control codes the value of each of which control codes is associated with a respective prescribed rate of change of frequency to be produced by said variable frequency generator for a corresponding respective subinterval of time, and means for sequentially accessing from said memory said control codes and producing therefrom a plurality of respective ramp voltage signals that are coupled to said generator as said input control signals thereto;

second means, coupled to the output of said variable frequency generator, for producing a plurality of outputs representative of the variations in frequency produced by said variable frequency generator during said subintervals of time in response to said plurality of input control signals supplied thereto by said first means;

third means for comparing the plurality of outputs produced by said second means with a plurality of respective reference signals supplied thereto indicative of intended variations in frequency produced by said variable frequency generator during said subintervals of time, and generating a plurality of difference signals representative of the respective deviations therefrom; and fourth means for modifying said plurality of input control codes stored in said memory means in accordance with difference signals generated by said third means.

2. A system according to claim 1, wherein said fourth means includes means for modifying the respective plurality of input control codes stored in said memory means in accordance with respective ones of the plurality of difference signals generated by said third means.

3. A system according to claim 1, wherein said fourth means includes means for modifying the respective plurality of input control codes stored in said memory means in accordance with difference signals generated by said third means other than respective ones of said plurality of difference signals.

4. A system according to claim 4, wherein said first means further comprises means for storing a reference control code the value of which is modifiable by said fourth means and representative of a prescribed rate of change of frequency to be produced by said generator during a selected one of said subintervals of time, and means, responsive to said reference control code, for producing a ramp voltage that is coupled to said generator as an input control signal.

5. A system according to claim 4, wherein said fourth means includes means, responsive to one of the difference signals generated by said third means, for selectively modifying the reference control code stored by said storing means.

6. A system according to claim 5, wherein said fourth means includes means, responsive to said one of the difference signals generated by said third means, for causing said selectively modified control code to be stored in a location in said memory means associated with said selected one of said subintervals of time.

7. A system according to claim 6, wherein said fourth means comprises means for successively selectively modifying the reference control code stored by said storing means during successively repeated ones of said selected subintervals of time until the difference signal generated by said third means associated with one of said subintervals of time bears a prescribed relationship with respect to the intended variation in the frequency produced by said variable frequency generator for that one subinterval of time and thereby causes the selectively modified reference control code to be stored in said location in said memory means associated with a predetermined subinterval of time.

8. A system according to claim 7, wherein said fourth means comprises means for causing said selectively modified reference control code to be stored in location in said memory means associated with said one of said subintervals of time.

9. A system according to claim 7, wherein said fourth means comprises means for causing said selectively modified reference control code to be stored in the location in said memory means associated with a prescribed subinterval of time other than said one of said subintervals of time.

10. A system according to claim 6, wherein said second means comprises means for counting the number of zero-crossings in the output frequency of said variable frequency generator during respective ones of said subintervals of time and producing respective count outputs representative thereof.

11. A system according to claim 10, wherein said third means comprises means for comparing the count outputs produced by said second means for said subintervals of time with respective reference counts associated with said intended variations in frequency produced by said variable frequency generator and generating said difference signals in accordance with respective differences in count values.

12. A system according to claim 11, wherein said third means comprises means for storing a prescribed reference count code representative of the count associated with an intended variation in frequency for a first of said subintervals that encompass the time interval over which said output frequency variation is produced by said generator, and means for successively modifying said prescribed reference count code for successive ones of said subintervals.

13. A system according to claim 1, wherein said second means comprises means for counting the number of zero-crossings in the output frequency of said variable frequency generator during respective ones of said subintervals of time and producing respective count outputs representative thereof.

14. A system according to claim 13, wherein said third means comprises means for comparing the count outputs produced by said second means for said subintervals of time with respective reference counts associated with said intended variations in frequency produced by said variable frequency generator and generating said difference signals in accordance with respective differences in count values.

15. A system according to claim 14, wherein said first means further comprises means for storing a reference control code the value of which is modifiable by said fourth means and representative of a prescribed rate of change of frequency to be produced by said generator during a selected one of said subintervals of time, and means, responsive to said reference control code, for producing a ramp voltage that is coupled to said generator as an input control signal.

16. A system according to claim 15, wherein said fourth means includes means, responsive to one of the difference signals generated by said third means, for selectively modifying the reference control code stored by said storing means.

17. A system according to claim 16, wherein said fourth means includes means, responsive to said one of the difference signals generated by said third means, for causing said selectively modified control code to be stored in a location in said memory means associated with said selected one of said subintervals of time.

18. A system according to claim 17, wherein said fourth means comprises means for successively selectively modifying the reference control code stored by said storing means during successively repeated ones of said selected subintervals of time until the difference signal generated by said third means associated with one of said subintervals of time bears a prescribed relationship with respect to the intended variation in the frequency produced by said variable frequency generator for that one subinterval of time and thereby causes the selectively modified reference control code to be stored in said location in said memory means associated with a predetermined subinterval of time.

19. For use with a variable frequency generator which produces a variable output frequency the value of which depends upon an input control signal applied thereto, a method of correcting for deviations in the output frequency variation produced by said generator from an intended frequency variation as defined by a prescribed input control signal variation comprising the steps of:
(a) supplying to said variable frequency generator a plurality of input control signals the value of each of which changes with time so as to have a respective prescribed slope during a respective subinterval of time within a defined interval of time during which said variable frequency generator is to produce said intended frequency variation, and including the steps of
(a-1) storing, in memory, a plurality of input control codes the value of each of which is associated with a respective prescribed rate of change of frequency to be produced by said generator for a corresponding respective subinterval of time, and
(a-2) sequentially accessing said stored control codes and producing therefrom a plurality of respective ramp voltage signals that are coupled to said generator as said input control signals,
(b) producing a plurality of signals representative of the variations in frequency produced by said variable frequency generator during said subintervals of time in response to said plurality of input control signals supplied by step (a);
(c) comparing the plurality of signals produced by step (b) with a plurality of respective reference signals indicative of intended variations in frequency produced by said variable frequency generator during said subintervals of time, and generating a plurality of difference signals representative of the respective deviations therefrom; and
(d) modifying said plurality of input control codes stored in step (a) in accordance with difference signals generated by step (c).

20. A method according to claim 19, wherein step (d) includes the step of modifying the respective plurality of input control codes stored in step (a) in accordance with respective ones of the plurality of difference signals generated in step (c).

21. A method according to claim 19, wherein said step (d) includes the step of modifying the respective plurality of input control codes stored in step (a) in accordance with difference signals generated in step (c) other than respective ones of said plurality of difference signals.

22. A method according to claim 19, wherein step (a) further includes the steps of
(a-3) storing a reference control code the value of which is modifiable in step (d) and representative of a prescribed rate of change of frequency to be produced by said generator during a selected one of said subintervals of time, and
(a-4) producing, in response to the reference control code stored in step (a-3), a ramp voltage that is coupled to said generator as an input control signal.

23. A method according to claim 21, wherein step (d) comprises selectively modifying the reference control code stored in step (a-3) in response to one of the difference signals generated in step (c).

24. A method according to claim 23, wherein step (d) comprises causing said selectively modified control code to be stored in a location in said memory associated with said selected one of said subintervals of time in response to one of the difference signals generated in step (c).

25. A method according to claim 24, wherein step (d) comprises successively selectively modifying the reference control code stored in step (a-3) during successively repeated ones of said selected subintervals of time until the difference signal generated in step (c) associated with one of said subintervals of time bears a prescribed relationship with respect to the intended variation in the frequency produced by said variable frequency generator for that one subinterval of time and thereby causes the selectively modified reference control code to be stored in said location in said memory associated with a predetermined subinterval of time.

26. A method according to claim 19, wherein step (b) comprises counting the number of zero-crossings in the output of said variable frequency generator during respective ones of said subintervals of time and producing respective count values representative thereof.

27. A method according to claim 26, wherein step (c) comprises comparing the count signals produced in step (b) for said subintervals of time with respective reference count values associated with said intended variations in frequency produced by said variable frequency generator and generating said difference signals in accordance with respective differences in count values.

28. A method according to claim 27, wherein step (c) comprises storing a prescribed reference count code representative of the count associated with an intended variation in frequency for a first of said subintervals that encompass the time interval over which said output frequency variation is produced by said generator, and successively modifying said prescribed reference count code for successive ones of said subintervals.

29. For use with a variable frequency generator which produces a variable output frequency the value of which depends upon an input control signal applied thereto, a method of controlling the operation of said variable frequency generator comprising the steps of:
(I), in a first, calibrate mode of operation, correcting for deviations in the output frequency variation produced by said generator from an intended frequency variation as defined by a prescribed input control signal variation comprising the steps of:
(a) supplying to said variable frequency generator a plurality of input control signals the value of each of which changes with time, so as to have a respective prescribed slope during a respective subinterval of time within a defined interval of time during which said variable frequency generator is to produce said intended frequency variations,
(b) producing a plurality of signals representative of the variations in frequency produced by said variable frequency generator during said subintervals of time in response to said plurality of input control signals supplied by step (a), (c) comparing the plurality of signals produced by step (b) with a plurality of respective reference signals indicative of intended variations in frequency produced by said variable frequency generator during said subintervals of times, and generating a plurality of difference signals representative of the respective deviations therefrom, and (d) modifying said plurality of input control signals supplied to said variable frequency generator in step (a) in accordance with difference signals generated by step (c); and (II) in a second, run mode of operation, varying the output frequency of said variable frequency generator by supplying thereto input control signals that have been obtained in accordance with steps (a) - (d) of the calibrate mode of operation of step (I).

30. A method according to claim 29, wherein, in step (II), the rate at which input control signals are supplied to variable frequency generator in said second, run mode of operation thereof, is greater that the rate at which input control signals are supplied to said variable frequency generator in said first, calibrate mode of operation thereof in step (I).

31. A method according to claim 30, wherein step (a) includes the steps of (a-1) storing, in memory, a plurality of input control codes the value of each of which is associated with a respective prescribed rate of change of frequency to be produced by said generator for a corresponding respective subinterval of time, and (a-2) sequentially accessing said stored control codes and producing therefrom a plurality of respective ramp voltage signals that are coupled to said generator as said input control signals.

* * * * *